United States Patent
Kobayashi et al.

(10) Patent No.: US 7,612,442 B2
(45) Date of Patent: Nov. 3, 2009

(54) SEMICONDUCTOR DEVICE

(75) Inventors: Hiroya Kobayashi, Hamamatsu (JP); Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 83 days.

(21) Appl. No.: 10/573,468

(22) PCT Filed: Sep. 24, 2004

(86) PCT No.: PCT/JP2004/013963

§ 371 (c)(1),
(2), (4) Date: Dec. 1, 2006

(87) PCT Pub. No.: WO2005/031870

PCT Pub. Date: Apr. 7, 2005

(65) Prior Publication Data

US 2007/0272998 A1    Nov. 29, 2007

(30) Foreign Application Priority Data

Sep. 25, 2003    (JP)    ............... P2003-333860

(51) Int. Cl.
*H01L 23/02*    (2006.01)
(52) U.S. Cl. ............ 257/680; 267/681; 267/447; 438/116
(58) Field of Classification Search .......... 257/460, 257/680, 447, 466, E25.032, E33.056, E33.059; 438/107
See application file for complete search history.

(56) References Cited

U.S. PATENT DOCUMENTS

| 5,818,113 | A | 10/1998 | Iseki et al. |
| 5,918,113 | A | 6/1999 | Higashi et al. |
| 6,201,305 | B1 | 3/2001 | Darveaux et al. |
| 6,204,163 | B1 | 3/2001 | Panchou et al. |
| 6,410,415 | B1 | 6/2002 | Estes et al. |
| 6,571,466 | B1 | 6/2003 | Glenn et al. |
| 6,605,828 | B1 * | 8/2003 | Schwarzrock et al. ......... 257/81 |
| 6,828,657 | B2 * | 12/2004 | Hara et al. .................. 257/623 |

(Continued)

FOREIGN PATENT DOCUMENTS

DE    19848834    7/1999

(Continued)

*Primary Examiner*—Theresa T Doan
(74) *Attorney, Agent, or Firm*—Drinker Biddle & Reath LLP

(57) ABSTRACT

With this semiconductor device, the distortion and cracking of a thinned portion of a semiconductor substrate are prevented to enable high precision focusing with respect to a photodetecting unit and uniformity and stability of high sensitivity of the photodetecting unit to be maintained. A semiconductor device 1 has a semiconductor substrate 10, a wiring substrate 20, conductive bumps 30, and a resin 32. A CCD 12 and a thinned portion 14 are formed on semiconductor substrate 10. Electrodes 16 of semiconductor substrate 10 are connected via conductive bumps 30 to electrodes 22 of wiring substrate 20. Wiring substrate 20 is subject to a wettability processing by which a region 26a that surrounds a region opposing thinned portion 14 and regions 26b that extend to the outer side from region 26a are lowered in the wettability with respect to the resin. Insulating resin 32 fills a gap between outer edge 15 of thinned portion 14 and wiring substrate 20 in order to reinforce the bonding strengths of conductive bumps 30.

5 Claims, 12 Drawing Sheets

U.S. PATENT DOCUMENTS

| | | |
|---|---|---|
| 7,060,602 B2 | 6/2006 | Saito |
| 7,274,101 B2 | 9/2007 | Tomita et al. |
| 2002/0008315 A1 | 1/2002 | Park |
| 2002/0020859 A1 | 2/2002 | Muramatsu |
| 2002/0084532 A1 | 7/2002 | Neogi et al. |
| 2002/0115278 A1 | 8/2002 | Kawai |
| 2007/0205480 A1 | 9/2007 | Kobayashi et al. |
| 2007/0272997 A1* | 11/2007 | Kobayashi et al. .......... 257/460 |
| 2007/0272998 A1 | 11/2007 | Kobayashi et al. |

FOREIGN PATENT DOCUMENTS

| | | |
|---|---|---|
| EP | 0 544 294 | 6/1993 |
| EP | 0 821 408 | 1/1998 |
| EP | 1 154 457 | 11/2001 |
| EP | 1 223 612 | 7/2002 |
| JP | 6-29506 | 2/1994 |
| JP | 6-196680 | 7/1994 |
| JP | 11026922 | 1/1999 |
| JP | 2000-228573 | 8/2000 |
| JP | 2002/009265 | 1/2002 |
| JP | 2003-078120 | 3/2003 |
| JP | 2003-124259 | 4/2003 |
| JP | 2003-168792 | 6/2003 |
| JP | 2004-214344 | 7/2004 |
| JP | 2004-247611 | 9/2004 |
| WO | WO 03/028414 A1 | 4/2003 |

* cited by examiner

SEMICONDUCTOR DEVICE

TECHNICAL FIELD

This invention concerns a semiconductor device and particularly concerns a back-illuminated semiconductor device.

BACKGROUND ART

A so-called back-illuminated semiconductor photodetecting device has been known conventionally as a semiconductor device. This type of semiconductor device has a semiconductor substrate and has a photodetecting unit on one surface of the semiconductor substrate. A portion of the semiconductor substrate on the side opposite the photodetecting unit is trimmed to form a recessed portion in the semiconductor substrate. A thinned portion is thus provided at the portion of the semiconductor substrate at which the photodetecting unit is disposed. This thinned portion is provided to accommodate ultraviolet rays, soft X-rays, electronic beams, and other energy rays that will be absorbed and cannot be detected at high sensitivity by a thick semiconductor substrate. At this thinned portion, light that is made incident on the surface at the recessed portion side of the semiconductor substrate is detected by the photodetecting unit.

As an example of a back-illuminated semiconductor device, there is a semiconductor device that has a BT-CCD (back-thinned CCD). The BT-CCD is used as a detecting unit of a semiconductor inspecting device. An example of a conventional semiconductor device having a BT-CCD is described in Patent Document 1.

FIG. 12 is a sectional view of an arrangement of the semiconductor device described in Patent Document 1. As shown in FIG. 12, a P-type silicon layer 104, which is a semiconductor substrate having a CCD 103 on a surface that opposes a wiring substrate 102, is mounted via metal bumps 105 onto wiring substrate 102, which is fixed to a bottom portion of the interior of a package 101. Each wiring 106 on wiring substrate 102 is connected at one end to a metal bump 105 and has a bonding pad (not shown) for externally taking out detected signals at the other end, and each bonding pad is electrically connected by a bonding wire 107 to a lead terminal (not shown) of package 101. Furthermore, a gap between wiring substrate 102 and P-type silicon layer 104 is filled with an underfill resin 108 for reinforcing the bonding strengths of metal bumps 105.

Patent Document 1: Japanese Published Unexamined Patent Application No. Hei 6-196680

However, when the underfill resin fills the gap between the wiring substrate and the thinned portion of the semiconductor substrate as shown in FIG. 12, the thinned portion may crack due to the stress that arises due to a thermal expansion coefficient difference between the underfill resin and the semiconductor substrate in the process of heating or cooling to cure the underfill resin. Even if cracking does not occur, the thinned portion may become distorted by being pulled by the contraction of underfill resin. Such distortion of the thinned portion of the semiconductor substrate may bring about adverse effects on focusing with respect to the photodetecting unit and uniformity and stability of sensitivity of the photodetecting unit during use of the semiconductor device.

This invention was made to resolve the above issue and an object thereof is to provide a semiconductor device, with which the distortion and cracking of a thinned portion of a semiconductor substrate are prevented to enable high precision focusing with respect to a photodetecting unit and uniformity and stability of high sensitivity of the photodetecting unit to be maintained.

DISCLOSURE OF THE INVENTION

In order to achieve the above object, this semiconductor device comprises: a semiconductor substrate, having a photodetecting unit formed on one surface, a thinned portion formed by etching a region, opposing the photodetecting unit, of another surface, and first electrodes disposed on the one surface at an outer edge of the thinned portion and electrically connected to the photodetecting unit; a wiring substrate, disposed to oppose the one surface side of the semiconductor substrate and having second electrodes connected via conductive bumps to the first electrodes; and a resin, filling a gap between the wiring substrate and the outer edge of the thinned portion to reinforce the strengths of bonding of the respective first electrodes and the respective second electrodes with the conductive bumps; and the wiring substrate is subject to a wettability processing, by which a first region that surrounds a region opposing the thinned portion and second regions that extend outward from the first region are lowered in wettability with respect to the resin, and the resin surrounds the periphery of the gap between the thinned portion and the wiring substrate except at the second regions that are portions of the periphery.

With this semiconductor device, the resin fills the gap between the wiring substrate and the outer edge of the thinned portion. The strength of bonding of the conductive bumps with the first electrodes that are disposed at the outer edge of the thinned portion and the strength of bonding of the conductive bumps with the second electrodes of the wiring substrate are thus reinforced. Meanwhile, because the resin does not fill a gap between the wiring substrate and the thinned portion of the semiconductor substrate, even when stress due to the thermal expansion coefficient difference between the resin and the semiconductor substrate arises during heating or cooling in the process of curing the resin, etc., the influence of the stress on the thinned portion will be small and distortion and cracking of the thinned portion will be prevented. Thus with this semiconductor device, high precision focusing is enabled with respect to the photodetecting unit and uniformity and stability of high sensitivity of the photodetecting unit can be exhibited during use.

Furthermore, the wiring substrate is subject to the wettability processing that lowers the wettability with respect to the resin of the first region, which surrounds the region opposing the thinned portion. Thus, for example, in the process of filling the gap between the semiconductor substrate and the wiring substrate with the resin using the capillary phenomenon during manufacture of the semiconductor device, when the resin entering into the gap from the periphery of the semiconductor substrate reaches the first region, the capillary phenomenon does not proceed further and the entry of the resin stops because the region is low in wettability. By such a wettability processing being applied to the wiring substrate, an arrangement, wherein the resin fills the gap at which the conductive bumps exist, that is, the gap between the wiring substrate and the outer edge of the thinned portion while the gap between the wiring substrate and the thinned portion at the inner side of the first region is left unfilled, can be readily realized.

A sealed space may form when the gap between the thinned portion and the wiring substrate is completely surrounded by the resin. In this case, the thinned portion may become distorted due to expansion or contraction of the air inside the sealed space during heating or cooling in the process of curing the resin, etc. In regard to this issue, with the present semiconductor device, the arrangement wherein the resin surrounds the periphery of the gap except at portions of the periphery is provided to prevent the gap from becoming sealed.

Moreover, the wiring substrate is subject to the wettability processing that lowers the wettability with respect to the resin of the second regions that extend outward from the first region. Thus, for example, in the process of filling with the resin using the capillary phenomenon as mentioned above, because the progress of the resin stops upon reaching the second regions, spaces that are not filled with the resin are formed above the second regions. The arrangement, wherein the resin surrounds the periphery of the gap between the thinned portion and the wiring substrate except at portions of the periphery, can thus be readily realized.

As the wettability processing, a silicone resin, a polytetrafluoroethylene, or a wax is favorably coated onto the first region and the second regions of the wiring substrate. In this case the wettability processing can be performed at low cost.

The semiconductor device may comprise: a semiconductor substrate, having a photodetecting unit formed on one surface, a thinned portion formed by etching a region, opposing the photodetecting unit, of another surface, and first electrodes disposed on the one surface at an outer edge of the thinned portion and electrically connected to the photodetecting unit; a wiring substrate, disposed to oppose the one surface side of the semiconductor substrate and having second electrodes connected via conductive bumps to the first electrodes; and a resin, filling a gap between the wiring substrate and the outer edge of the thinned portion to reinforce the strengths of bonding of the respective first electrodes and the respective second electrodes with the conductive bumps; and the wiring substrate may have formed thereon a first protrusion that surrounds a region opposing the thinned portion and second protrusions that extend outward from the first protrusion, and the resin may surround the periphery of the gap between the thinned portion and the wiring substrate except at the second protrusions that are portions of the periphery.

With this semiconductor device, the resin fills the gap between the wiring substrate and the outer edge of the thinned portion. The strength of bonding of the conductive bumps with the first electrodes that are disposed at the outer edge of the thinned portion and the strength of bonding of the conductive bumps with the second electrodes of the wiring substrate are thus reinforced. Meanwhile, because the resin does not fill a gap between the wiring substrate and the thinned portion of the semiconductor substrate, even when stress due to the thermal expansion coefficient difference between the resin and the semiconductor substrate arises during heating or cooling in the process of curing the resin, etc., the influence of the stress on the thinned portion will be small and distortion and cracking of the thinned portion will be prevented. Thus with this semiconductor device, high precision focusing with respect to the photodetecting unit is enabled and uniformity and stability of high sensitivity of the photodetecting unit can be exhibited during use.

Furthermore, the wiring substrate has formed thereon the first protrusion that surrounds the region opposing the thinned portion. Thus, for example, in the process of filling the gap between the semiconductor substrate and the wiring substrate with the resin using the capillary phenomenon during manufacture of the semiconductor device, when the resin entering into the gap from the periphery of the semiconductor substrate reaches the first protrusion, the capillary phenomenon does not proceed further and the entry of the resin stops. By such a first protrusion being provided on the wiring substrate, an arrangement, wherein the resin fills the gap at which the conductive bumps exist, that is, the gap between the wiring substrate and the outer edge of the thinned portion while the gap between the wiring substrate and the thinned portion at the inner side of the first protrusion is left unfilled, can be readily realized.

A sealed space may form when the gap between the thinned portion and the wiring substrate is completely surrounded by the resin. In this case, the thinned portion may become distorted due to expansion or contraction of the air inside the sealed space during heating or cooling in the process of curing the resin, etc. In regard to this issue, with the present semiconductor device, the arrangement, wherein the resin surrounds the periphery of the gap except at portions of the periphery, is provided to prevent the gap from becoming sealed.

Moreover, the wiring substrate has formed thereon the second protrusions that extend outward from the first protrusion. Thus, for example, in the process of filling with the resin using the capillary phenomenon as mentioned above, because the progress of the resin stops upon reaching the second protrusions, spaces that are not filled with the resin are formed above the second protrusions. The arrangement, wherein the resin surrounds the periphery of the gap between the thinned portion and the wiring substrate except at portions of the periphery, can thus be readily realized.

The photodetecting unit may have a plurality of pixels (CCD) that are arrayed one-dimensionally or two-dimensionally. This invention's semiconductor device is especially useful in this case because uniformity and stability of high sensitivity is required among the plurality of pixels.

The first protrusions are discontinuous at the positions of the second protrusions and the interior of the gap and the exterior is made communicable at these positions of discontinuity.

By this invention, a semiconductor device can be realized with which the distortion and cracking of a thinned portion of a semiconductor substrate are prevented to enable high precision focusing with respect to a photodetecting unit and uniformity and stability of high sensitivity of the photodetecting unit to be maintained.

Figure 1:
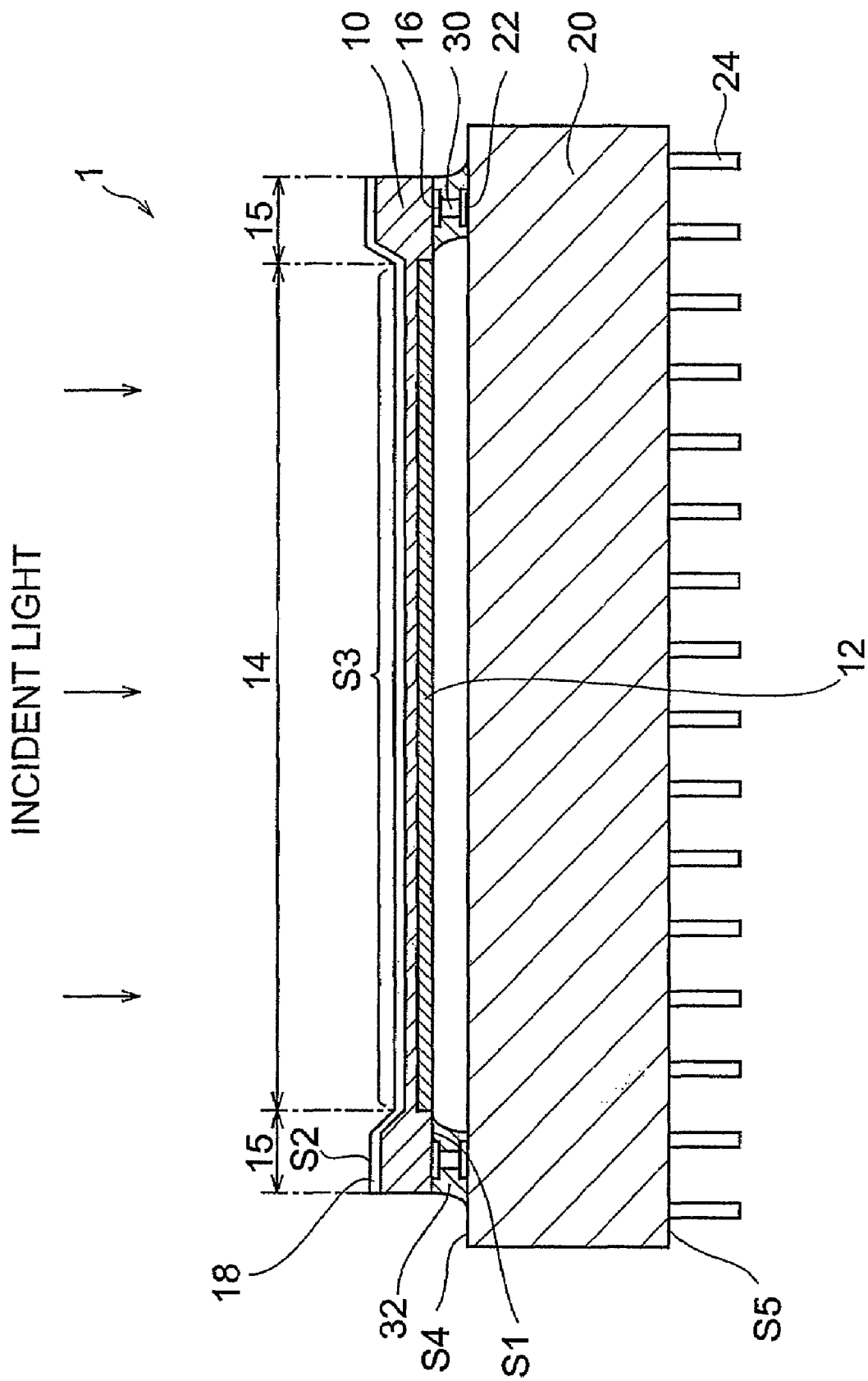
FIG. 1 is a sectional view of an embodiment of this invention's semiconductor device.

EXPLANATION OF REFERENCE NUMERALS 1,2 . . . semiconductor device
10 . . . semiconductor substrate
14 . . . thinned portion
15 . . . outer edge
16 . . . electrode
18 . . . accumulation layer
20,20a,21,21a,21b . . . wiring substrate
22 . . . electrode
24 . . . lead terminal
26a . . . region (first region)
26b . . . region (second region)
27a,29a . . . protrusion(first protrusion)
27b,29b . . . protrusion(second protrusion)
28 . . . chip resistor
30 . . . conductive bump
32 . . . resin

BEST MODE FOR CARRYING OUT THE INVENTION

Preferred embodiments of this invention's semiconductor device shall now be described in detail along with the drawings. In the description of the drawings, the same elements shall be provided with the same symbols and overlapping description shall be omitted. The dimensional proportions in the drawings do not necessary match those of the description.

FIG. 1 is a sectional view of an embodiment of this invention's semiconductor device. A semiconductor device 1 has a semiconductor substrate 10, a wiring substrate 20, conductive bumps 30, and a resin 32. Semiconductor substrate 10 is a BT-CCD (back-thinned CCD) and has a CCD 12 formed as a photodetecting unit on a portion of a top layer of its front surface S1 side. Semiconductor substrate 10 includes, for example, a silicon P+ layer, a P-type epitaxial layer formed above the silicon P+ layer, and an unillustrated set of transfer electrodes formed on the epitaxial layer. CCD 12 has a plurality of pixels that are arrayed two-dimensionally. Also, a thinned portion 14 is formed by thinning by etching a region, opposing CCD 12, of a back surface S2. The etched portion has a truncated rectangular pyramidal profile. A surface of thinned portion 14 at the etched side is a flat and rectangular, light-incident surface S3, and this light-incident surface S3 is formed to be substantially the same in size as CCD 12. Semiconductor substrate 10 as a whole has a rectangular shape in plan view. Semiconductor substrate 10 is, for example, approximately 15 to 40 μm thick at thinned portion 14 and approximately 300 to 600 μm thick at an outer edge 15 of thinned portion 14. Outer edge 15 of thinned portion 14 refers to a portion of semiconductor substrate at the periphery of thinned portion 14 and is thicker than thinned portion 14.

Electrodes 16 (first electrodes) are formed on front surface S1 of outer edge 15. These electrodes 16 are electrically connected to the set of transfer electrodes of CCD 12 by wirings that are omitted from illustration. The entirety of back surface S2 of semiconductor substrate 10, including light-incident surface S3, is covered by an accumulation layer 18. Accumulation layer 18 is of the same conductive type as semiconductor substrate 10, however, is higher in impurity concentration than semiconductor substrate 10.

Semiconductor substrate 10 is mounted onto wiring substrate 20 by flip-chip bonding. Wiring substrate 20 is thus positioned to oppose the front surface S1 side of semiconductor substrate 10. Electrodes 22 (second electrodes) are formed at positions of wiring substrate 20 that oppose electrodes 16 of semiconductor substrate 10, and these electrodes 22 are connected via conductive bumps 30 to electrodes 16. Lead terminals 24, electrodes 22, conductive bumps 30, and electrodes 16 are thus connected to the CCD transfer electrodes and CCD drive signals are input into lead terminals 24. An output of an amplifier that outputs a CCD read signal is taken out from a lead terminal 24 via an electrode 16, a conductive bump 30, and an electrode 22. Wiring substrate 20 is formed, for example, of a multilayer ceramic substrate. An upper surface S4 (surface opposing semiconductor substrate 10) of wiring substrate 20 has a wider area than semiconductor substrate 10 and a region that does not oppose semiconductor substrate exists at an edge of upper surface S4.

Due to the interposition of conductive bumps 30, a gap exists between semiconductor substrate 10 and wiring substrate 20. Of this gap, a portion that is sandwiched by outer edge 15 and wiring substrate 20 is filled with insulating resin 32 (underfill resin) for reinforcing the bonding strengths of conductive bumps 30 (specifically the strengths of bonding of conductive bumps 30 with the respective electrodes 16 and electrodes 22). As resin 32, for example, an epoxy-based resin, a urethane-based resin, a silicone-based resin, an acrylic-based resin, or a composite of such resins is used.

Lead terminals 24 are disposed at a bottom surface S5 (surface at the opposite side of upper surface S4) of wiring substrate 20. Lead terminals 24 are connected to internal wirings (not shown) of wiring substrate 20.

Figure 2:
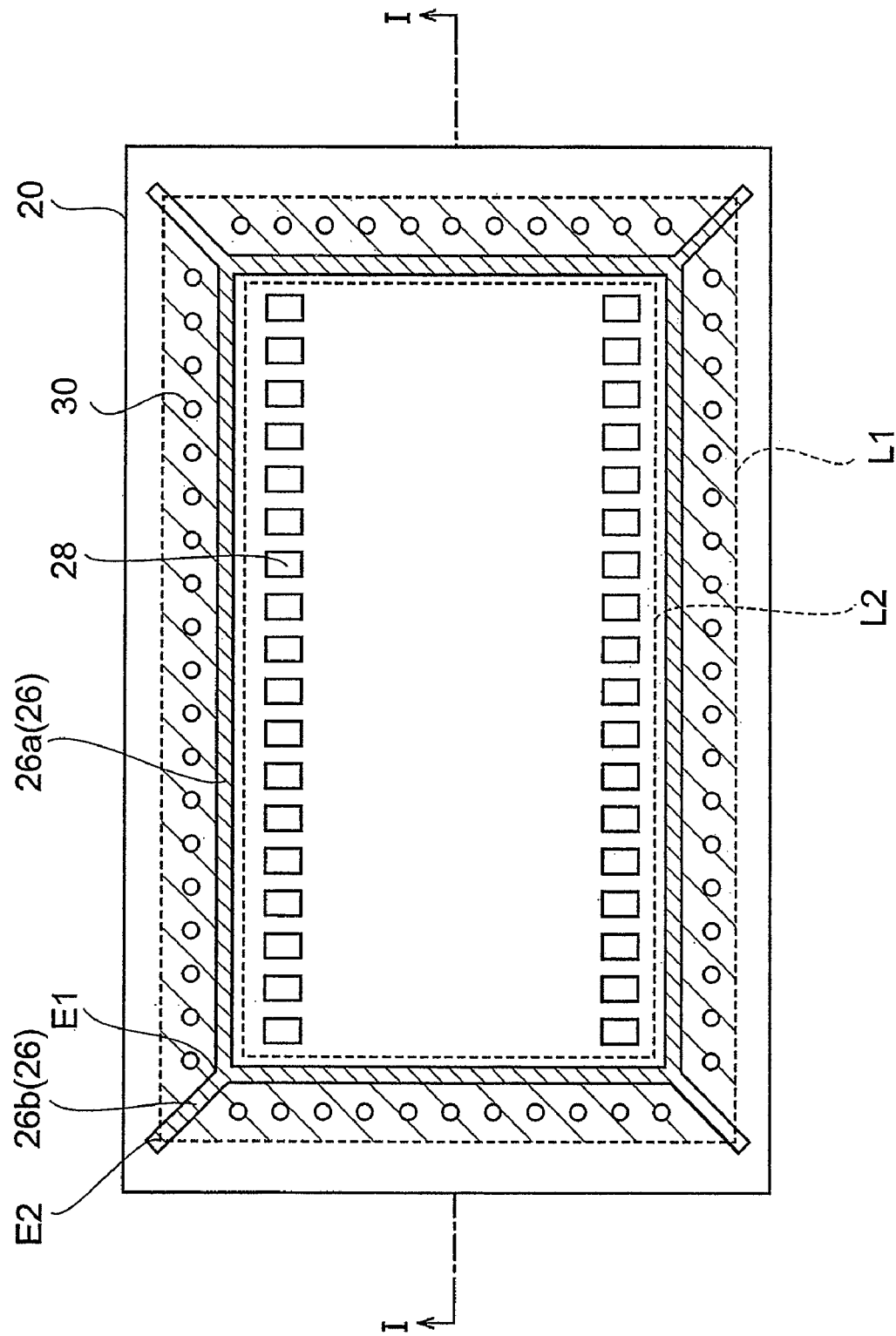
FIG. 2 is a plan view for describing a wettability processing applied to a wiring substrate 20 of FIG. 1.

A wettability processing is applied to upper surface S4 of wiring substrate 20, and this shall now be described using FIG. 2. FIG. 2 is a plan view of wiring substrate 20 as viewed from its upper surface S4 side. In FIG. 2, broken lines L1 and L2 indicate outlines of semiconductor substrate 10 and thinned portion 14, respectively. The sectional view taken on line I-I of this Figure corresponds to FIG. 1. As the wettability processing, a silicone resin is coated onto a region 26 of wiring substrate 20. The region coated with the silicone resin is indicated in the Figure by slanted lines of comparatively narrow interval. The wettability of region 26 with respect to resin 32 is thereby lowered in comparison to that of other regions of wiring substrate 20. Region 26 includes a region 26a (first region) and regions 26b (second regions).

Region 26a lies along and surrounds the periphery of a region (region surrounded by broken lines L2) that opposes thinned portion 14 of semiconductor substrate 10. On wiring substrate 20, region 26a has a rectangular shape as a whole. Meanwhile, regions 26b are disposed at a total of four locations, and one end E1 of each region 26b is connected to one of the four corners of region 26a, respectively. Another end E2 of each region 26b is exposed at the outer side of a region (region surrounded by broken lines L1) of wiring substrate 20 that opposes semiconductor substrate 10. Each of regions 26b thus extends from region 26a to the outer side of wiring substrate 20 and reaches the outer side of the region covered by resin 32.

In FIG. 2, the portions of the gap between semiconductor substrate 10 and wiring substrate 20 that are filled with resin 32 are indicated by slanted lines of comparatively wide interval. As shown in this Figure, in this embodiment, resin 32 fills only the portions of the gap at the outer side of region 26a and does not fill region 26a and portions at the inner side thereof. Although resin 32 thus surrounds the periphery of the gap between thinned portion 14 and wiring substrate 20, it does not surround the entire periphery but surrounds the periphery with the exception of portions of the periphery.

Furthermore, a plurality of chip resistors 28 are disposed on upper surface S4. Chip resistors 28 are aligned one-dimensionally in the left/right direction of the Figure, respectively at an upper portion and a lower portion in the Figure of the region surrounded by region 26a of wiring substrate 20.

Returning now to FIG. 1, operations of semiconductor device 1 shall be described. Light made incident on thinned portion 14 of semiconductor substrate 10 from light-incident surface S3 is detected by CCD 12. The detected signals pass through electrodes 16, conductive bumps 30, electrodes 22, in that order, and are thereby transmitted to wiring substrate 20. The detected signals (CCD read signals) are then transmitted to lead terminals 24 and output from lead terminals 24 to the exterior of semiconductor device 1.

The effects of semiconductor device 1 shall now be described. Resin 32 fills the gap between outer edge 15 of thinned portion 14 and wiring substrate 20. The strength of bonding of electrodes 16, disposed on outer edge 15 of thinned portion 14, with conductive bumps 30 and the strength of bonding of conductive bumps 30 with electrodes 22 of wiring substrate 20 are thereby reinforced. Meanwhile, because the gap between thinned portion 14 of semiconductor substrate 10 and wiring substrate 20 is not filled with resin 32, even if stress due to the thermal expansion coefficient difference between resin 32 and semiconductor substrate 10 arises between the two during heating or cooling in the process of curing resin 32, etc., the influence of the stress on thinned portion 14 will be low and distortion and cracking of thinned portion 14 are prevented. Thus with semiconductor device 1, high precision focusing with respect to CCD 12 is enabled and uniformity and stability of the high sensitivity of CCD 12 can be exhibited during use. Also, because cracking of thinned portion 14 is prevented, the manufacturing yield of semiconductor device 1 is improved.

Furthermore, by the wettability processing being applied to wiring substrate 20, the wettability with respect to the resin of region 26a, which surrounds the region opposing thinned portion 14, is lowered in comparison to that of other regions (except for regions 26b). Thus, for example, in the process of filling the gap between semiconductor substrate 10 and wiring substrate 20 with the resin using the capillary phenomenon during manufacture of semiconductor device 1, when the resin entering into the gap from the periphery of semiconductor substrate 10 reaches region 26a, the capillary phenomenon does not proceed further and the entry of the resin stops because region 26a is low in wettability. By such a wettability processing being applied to wiring substrate 20, the arrangement, wherein resin 32 fills the gap at which conductive bumps 30 exist, that is, the gap between wiring substrate 20 and outer edge 15 of thinned portion 14 while the gap between wiring substrate 20 and thinned portion 14 at the inner side of region 26a is left unfilled, can be readily realized.

A sealed space may form when the gap between thinned portion 14 and wiring substrate 20 is completely surrounded by the resin 32. In this case, thinned portion 14 may become distorted due to expansion or contraction of the air inside the sealed space during heating or cooling in the process of curing the resin, etc. In regard to this issue, with semiconductor device 1, the arrangement, wherein resin 32 surrounds the periphery of the gap except at portions of the periphery, is provided to prevent the gap from becoming sealed.

Moreover, by the wettability processing being applied to wiring substrate 20, the wettability with respect to the resin of regions 26b, which extend outward from region 26a, is lowered in comparison to that of other regions (except for region 26a). Thus, for example, in the process of filling with the resin using the capillary phenomenon as mentioned above, because the progress of the resin stops upon reaching regions 26b, spaces that are not filled with resin 32 are formed above regions 26b. The arrangement, wherein resin 32 surrounds the periphery of the gap between the thinned portion and the wiring substrate except at portions of the periphery, can thus be readily realized.

Because as the wettability processing, the silicone resin is coated onto region 26 of wiring substrate 20, the wettability processing can be performed at low cost. The processing is not limited to the use of a silicone resin and, for example, a polytetrafluoroethylene or a wax may be coated instead, and the wettability processing can be performed at low cost in such cases as well. The region to which the wettability processing is applied shall be referred to as a silicone resin layer, a polytetrafluoroethylene layer, or a wax layer.

Semiconductor substrate 10 is provided with accumulation layer 18. The accumulation state of semiconductor substrate 10 is thereby maintained. Thereby the uniformity and stability of the sensitivity of CCD 12 with respect to short wavelength light can be improved further.

Figure 12:
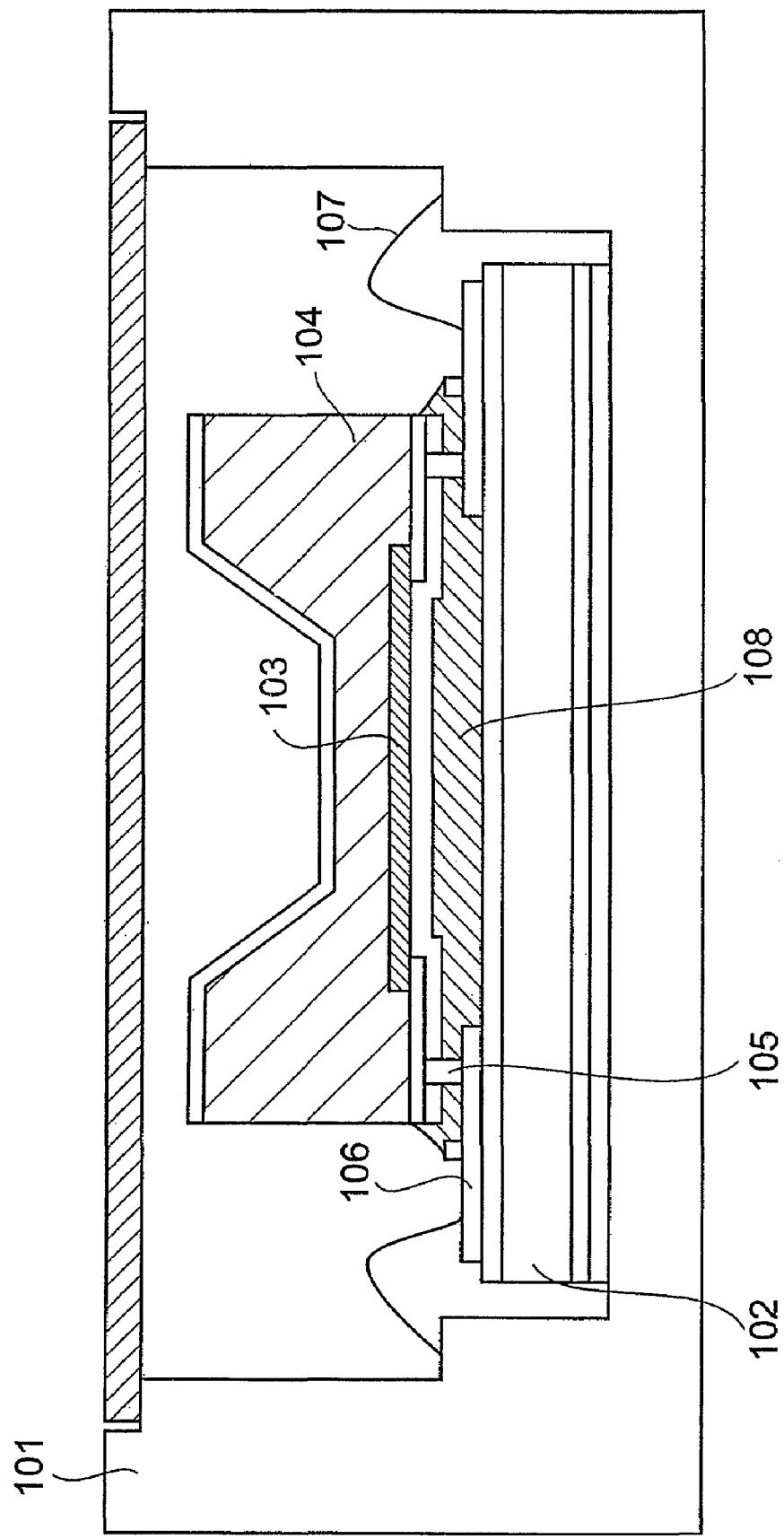
FIG. 12 is a sectional view of an arrangement of a conventional semiconductor device.

In recent years, demands for large area and high-speed response characteristics have been increasing for back-illuminated semiconductor devices. However, with an arrangement, such as that of the semiconductor device shown in FIG. 12, wherein the semiconductor substrate is die bonded once to the wiring substrate and then the wiring substrate is wire bonded to the lead terminals of the package, it is difficult to realize a large area and a high-speed response at the same time. That is, when the semiconductor device of this arrangement is made large in area, increased resistance occurs due to the accompanying elongation of the wires. Moreover, because in accordance with the making of the area large, the occurrence of crosstalk, the forming of capacitance (capacitor) between the wires, and other issues arise due to wires becoming close to each other and high in density, the realization of high-speed response is made even more difficult.

Meanwhile, with semiconductor device 1, because semiconductor substrate 10 is mounted onto wiring substrate 20 via conductive bumps 30, there is no need to perform wire bonding of semiconductor substrate 10 with wiring substrate 20. Furthermore, because wiring substrate 20 is provided with lead terminals 24, there is no need to perform wire bonding of wiring substrate 20 and lead terminals of a package with semiconductor device 1. Thus with semiconductor device 1, because all of the wirings can be arranged without using wire bonding, even if a large area is to be realized, the above-mentioned problems of increased resistance, occurrence of crosstalk, and forming of capacitance do not occur. Semiconductor device 1 can thus meet the demands of both large area and high-speed response. For example, when the number of pixels of CCD 12 is 2054 pixels×1024 pixels (with the chip size (area of semiconductor substrate 10) being slightly over 40.0 mm×20 mm), whereas speeding up of the response to a rate of 1.6 Gpixels/sec or more is difficult with the conventional semiconductor device, high-speed operation at 3.2 Gpixels/sec is enabled with semiconductor device 1.

Figure 3:
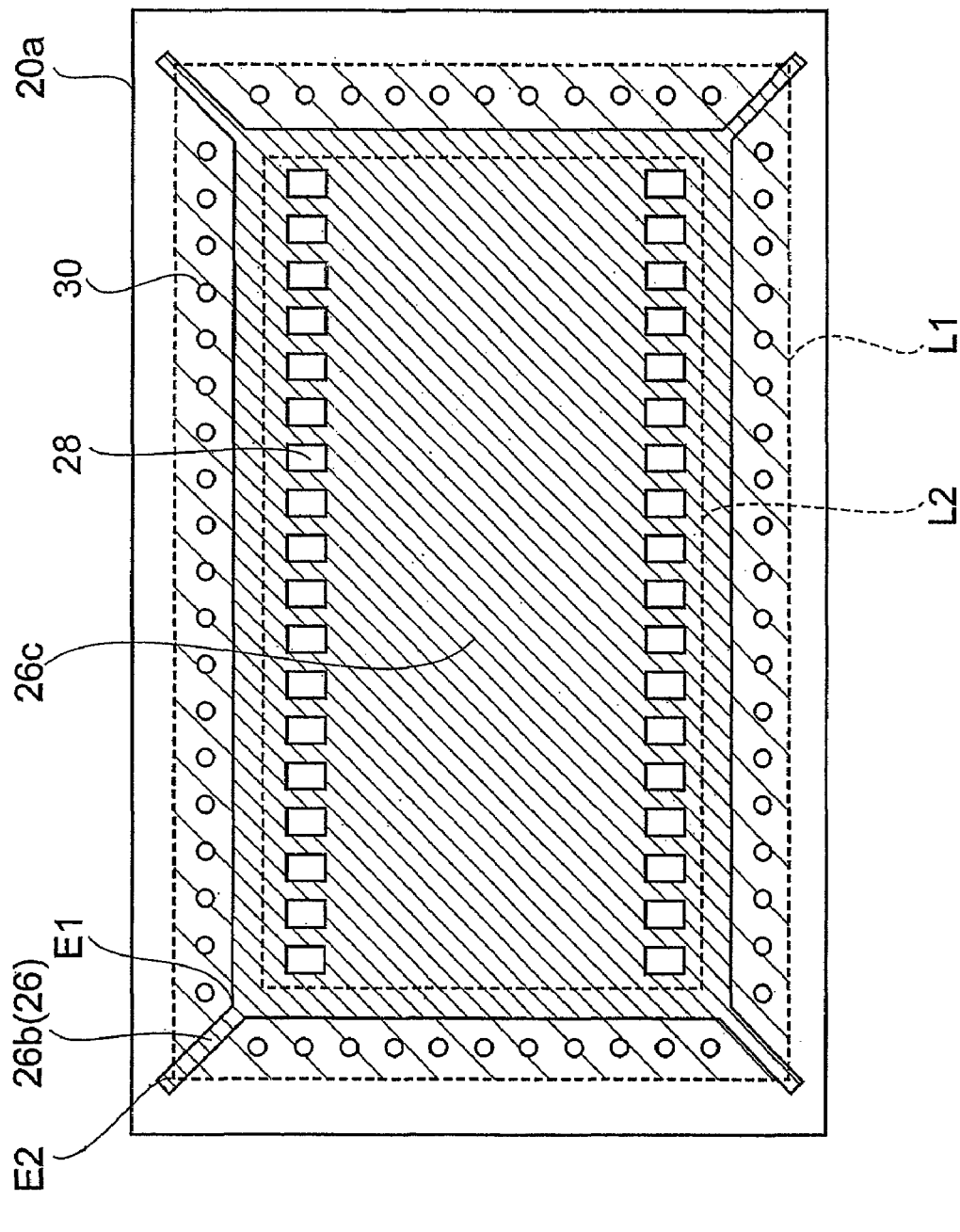
FIG. 3 is a plan view of a modification example of wiring substrate 20 of FIG. 2.

FIG. 3 is a plan view of a modification example of wiring substrate 20 of FIG. 2. A wiring substrate 20a differs from wiring substrate 20 in the region coated by the silicone resin. Wiring substrate 20a is the same as wiring substrate 20 in the arrangements of the other portions. As indicated by the slanted lines of comparatively narrow interval in the Figure, with wiring substrate 20a, the silicone resin is coated onto a region 26c, which includes a region that opposes thinned portion 14 and a region that surrounds the region opposing thinned portion 14. From the four corners of region 26c, the same regions 26b as those of FIG. 2 extend to the outer side of wiring substrate 20a, and these regions 26b are also coated with the silicone resin. Thus with wiring substrate 20a, regions 26b and 26c are made low in the wettability with respect to the resin in comparison to other regions.

With the semiconductor device having wiring substrate 20a of the above arrangement, because the wettability with respect to the resin of region 26c is lower than the regions at the outer side thereof, in the process of filling with the resin using the capillary phenomenon as mentioned above, the progress of the capillary phenomenon stops when the resin, which enters from the periphery of semiconductor substrate 10 into the gap between semiconductor substrate 10 and wiring substrate 20a, reaches region 26c. The arrangement, wherein resin 32 fills the gap at which conductive bumps 30 exist, that is, the gap between outer edge 15 of thinned portion 14 and wiring substrate 20a while the gap between thinned portion 14 and wiring substrate 20a is left unfilled, can thus be readily realized. Also with this example, because the wettability is also low at the inner side of the region (region corresponding to region 26a of FIG. 2) that surrounds the region opposing thinned portion 14, the above-mentioned arrangement can be realized even more definitely.

With wiring substrate 20a, it is sufficient that the silicone resin be coated at least on a region of region 26c that surrounds the region opposing thinned portion 14 and the region at the inner side may be coated just partially with the silicone resin.

Figure 4:
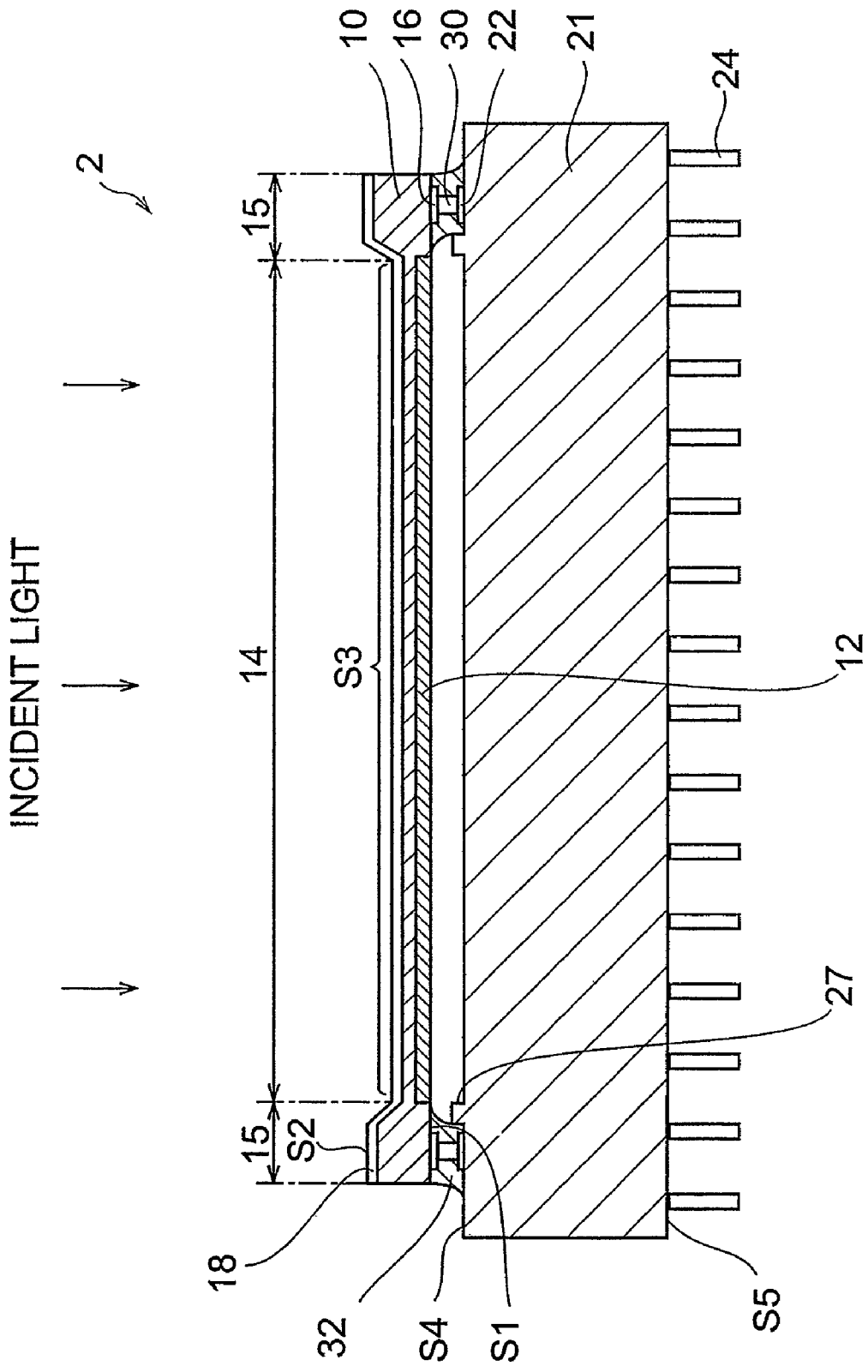
FIG. 4 is a sectional view of another embodiment of this invention's semiconductor device.

FIG. 4 is a sectional view of another embodiment of this invention's semiconductor device. A semiconductor device 2 has semiconductor substrate 10, a wiring substrate 21, conductive bumps 30, and resin 32. Because the arrangements of semiconductor substrate 10, conductive bumps 30, and resin 32 are the same as those of semiconductor device 1 of FIG. 1, description thereof shall be omitted.

Wiring substrate 21 is disposed opposite the front surface S1 side of semiconductor substrate 10 and has electrodes 22 formed at positions opposing electrodes 16 of semiconductor substrate 10. Lead terminals 24 are provided at bottom surface S5 of wiring substrate 21.

Figure 5:
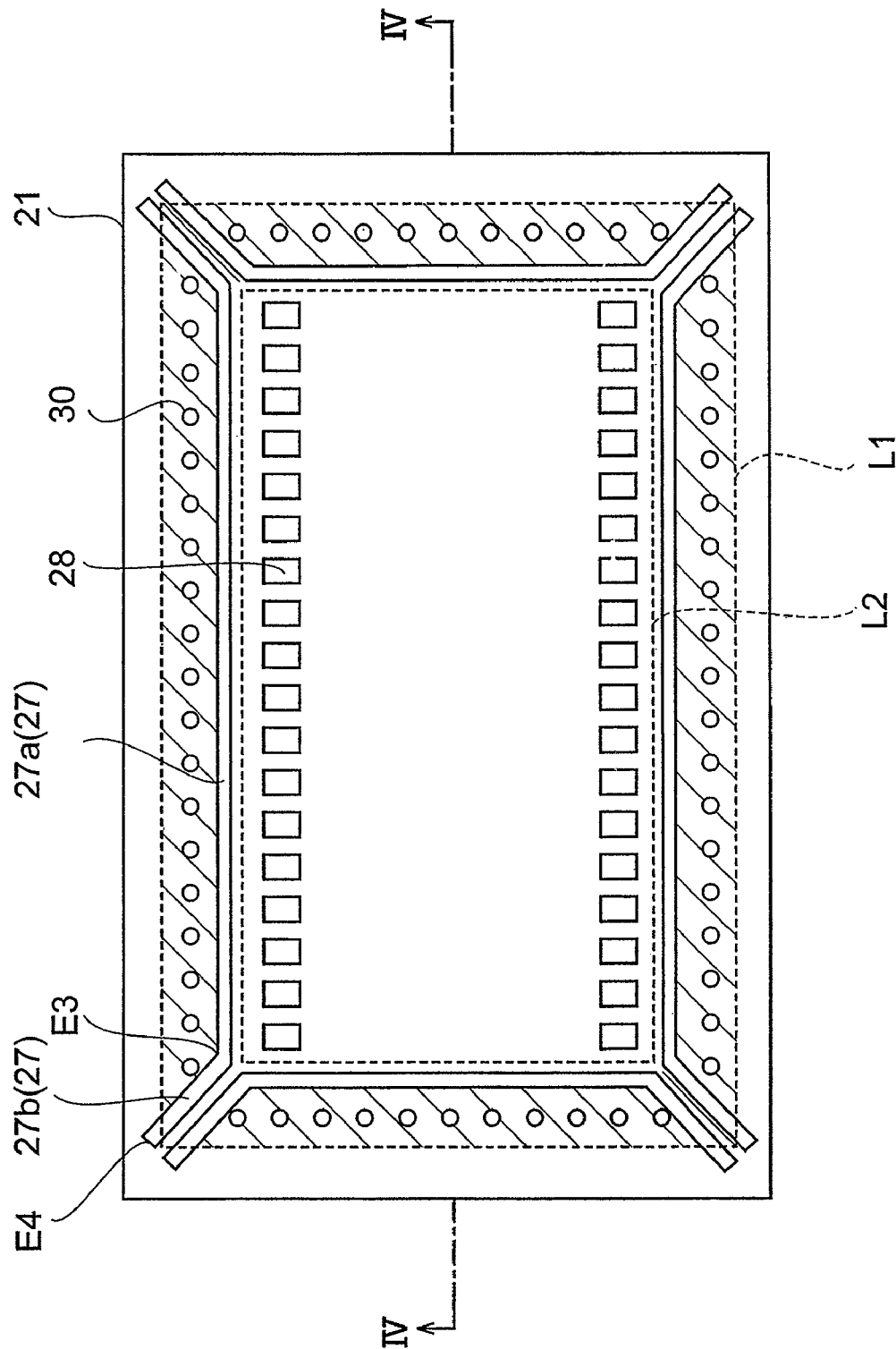
FIG. 5 is a plan view for describing an arrangement of protrusions 27 of FIG. 4.

Protrusions 27 are formed on upper surface S4 of wiring substrate 21, and these shall now be described using FIG. 5. FIG. 5 is a plan view of wiring substrate 21 as viewed from its upper surface S4 side. In FIG. 5, broken lines L1 and L2 indicate outlines of semiconductor substrate 10 and thinned portion 14, respectively. The sectional view taken on line IV-IV of this Figure corresponds to being FIG. 4. As shown in FIG. 5, each protrusion 27 includes a protrusion 27a (first protrusion) and protrusions 27b (second protrusions). Protrusions 27a and protrusions 27b are formed on upper surface S4 of wiring substrate 21 and are protruding strips that extend in directions within the plane of upper surface S4.

Protrusions 27a are formed along the periphery of a region of wiring substrate 21 that opposes thinned portion 14 of semiconductor substrate 14 and surrounds the region opposing thinned portion 14. A total of four protrusions 27a are formed and these form a substantially rectangular shape on wiring substrate 21. That is, protrusions 27a correspond to being the four sides of a rectangle. However, the ends of protrusions 27a do not contact each other and are spaced apart by a fixed interval. Meanwhile, a total of eight protrusions 27b are formed, and one end E3 of each protrusion 27b is connected to an end portion of a protrusion 27a at a predetermined angle. Protrusions 27b are thus connected to both ends of each of the four protrusions 27a. Another end E4 of each protrusion 27b is exposed at the outer side of the region of wiring substrate 21 that opposes semiconductor substrate 10. That is, each protrusion 27b extends from a protrusion 27a to the outer side of wiring substrate 21 and reaches the outer side of the region covered with resin 32. Furthermore, at each of the four corners of the rectangle, two mutually adjacent protrusions 27b extend in parallel while being spaced apart by a fixed interval. In other words, first protrusions 27a are discontinuous at the positions of second protrusions 27b, and the interior of the gap is made communicable with the exterior at these discontinuity positions.

In FIG. 5, the portions of the gap between semiconductor substrate 10 and wiring substrate 21 that are filled with resin 32 are indicated by slanted lines. As shown in this Figure, with this embodiment, resin 32 fills only portions of the gap at the outer side of protrusions 27a and does not fill protrusions 27a and portions at the inner side thereof. Portions at which protrusions 27b are formed and portions between two mutually adjacent protrusions 27b, although being portions at the outer side of protrusions 27a, are also not filled with resin 32. Furthermore, a plurality of chip resistors 28 are disposed on upper surface S4 of wiring substrate 21.

The effects of semiconductor device 2 shall now be described. Resin 32 fills the gap between outer edge 15 of thinned portion 14 and wiring substrate 21. The strength of bonding of electrodes 16, disposed on outer edge 15 of thinned portion 14, with conductive bumps 30 and the strength of bonding of conductive bumps 30 with electrodes 22 of wiring substrate 21 are thereby reinforced. Meanwhile, because the gap between thinned portion 14 of semiconductor substrate 10 and wiring substrate 21 is not filled with resin 32, even if stress due to the thermal expansion coefficient difference between resin 32 and semiconductor substrate 10 arises between the two during heating or cooling in the process of curing resin 32, etc., the influence of the stress on thinned portion 14 will be low and distortion and cracking of thinned portion 14 are prevented. Thus with semiconductor device 2, high precision focusing with respect to CCD 12 is enabled and uniformity and stability of the high sensitivity of CCD 12 can be exhibited during use. Also, because cracking of thinned portion 14 is prevented, the manufacturing yield of semiconductor device 2 is improved.

Furthermore wiring substrate 21 has formed thereon protrusions 27a that surround the region opposing thinned portion 14. Thus, for example, in the process of filling the gap between semiconductor substrate 10 and wiring substrate 21 with the resin using the capillary phenomenon in manufacturing semiconductor device 2, when the resin entering into the gap from the periphery of semiconductor substrate 10 reaches protrusions 27a, the capillary phenomenon does not proceed further and the entry of the resin stops. By such protrusions 27a being provided on wiring substrate 21, the arrangement, wherein resin 32 fills the gap at which conductive bumps 30 exist, that is, the gap between wiring substrate 21 and outer edge 15 of thinned portion 14 while the gap between wiring substrate 21 and thinned portion 14 at the inner side of protrusions 27a is left unfilled, can be readily realized. In terms of preventing the progress of the capillary phenomenon, the forming of protrusions 27 on the wiring substrate can be said to be a form of the wettability processing that was described above with semiconductor device of FIG. 1. That is, it can be said that protrusions 27 are formed as a wettability processing on wiring substrate 21.

A sealed space may form when the gap between thinned portion 14 and wiring substrate 21 is completely surrounded by the resin 32. In this case, thinned portion 14 may become distorted due to expansion or contraction of the air inside the sealed space during heating or cooling in the process of curing the resin, etc. In regard to this issue, with semiconductor device 2, the arrangement, wherein resin 32 surrounds the periphery of the gap except at portions of the periphery, is provided to prevent the gap from becoming sealed.

Moreover, wiring substrate 21 has formed thereon protrusions 27b that extend outward from protrusions 27a. Thus, for example, in the process of filling with the resin using the capillary phenomenon as mentioned above, because the progress of the resin stops upon reaching protrusions 27b, spaces that are not filled with resin 32 are formed at least above protrusions 27b. The arrangement, wherein resin 32 surrounds the periphery of the gap between thinned portion 14 and wiring substrate 21 except at portions of the periphery, can thus be readily realized. Especially with the present embodiment, because two protrusions 27b, which extend in parallel while being spaced apart by a fixed interval, are provided, a space, which is not filled with resin 32, is formed not just above protrusions 27b but also between the two protrusions 27b. The above-described arrangement can thus be realized more definitely.

Figure 6:
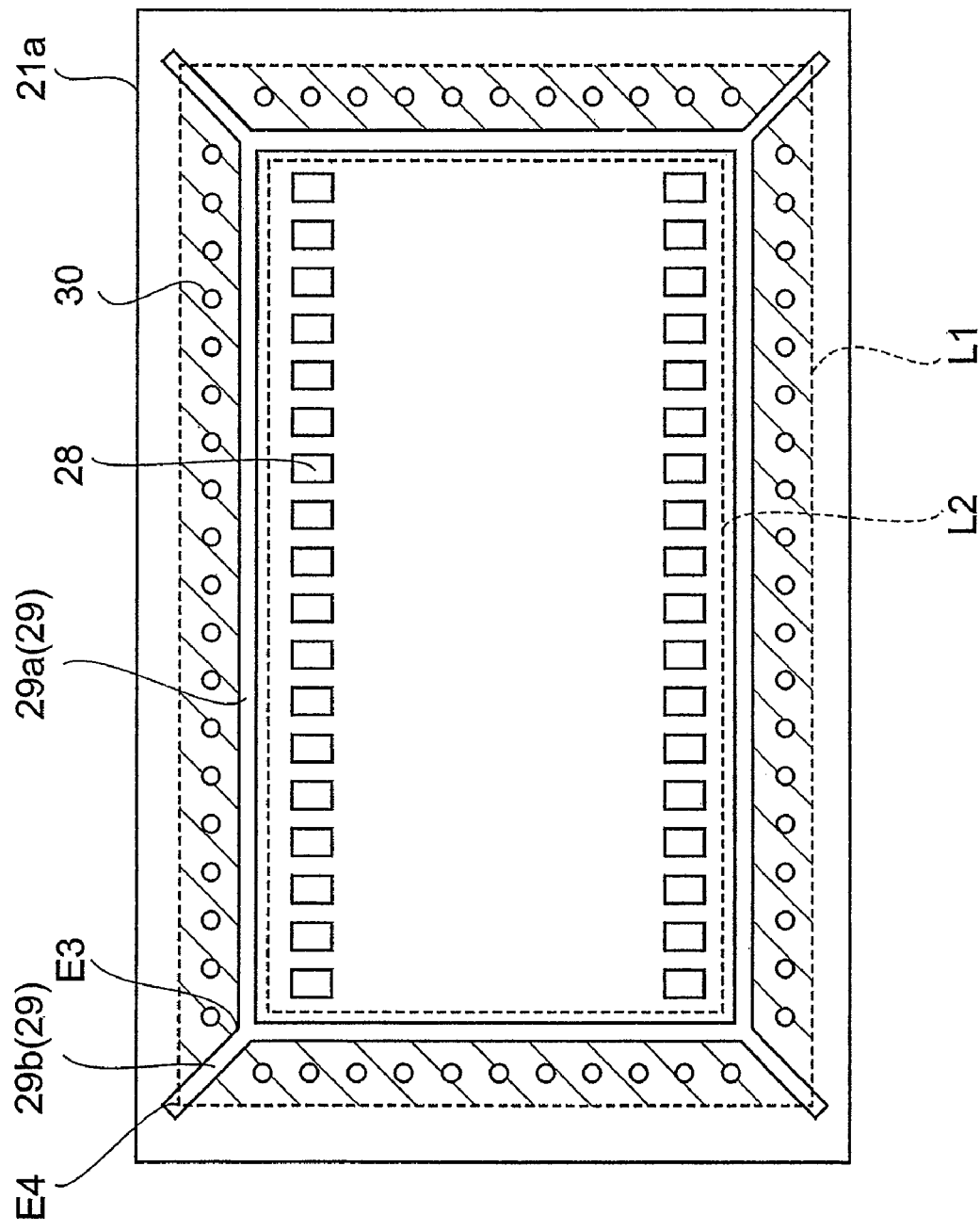
FIG. 6 is a plan view of a modification example of a wiring substrate 21 of FIG. 5.

FIG. 6 is a plan view of a modification example of wiring substrate 21 of FIG. 5. The arrangement of a protrusion 29 of a wiring 4 substrate 21a differs from that of protrusions 27 of wiring substrate 21. The other portions of wiring substrate 21a are the same in arrangement as those of wiring substrate 21. Protrusion 29 includes protrusions 29a and 29b. Protrusion 29a is formed along the periphery of the region opposing thinned portion 14 of wiring substrate 21a and surrounds the region opposing thinned portion 14. Protrusion 29a has a rectangular shape as a whole. Meanwhile, a total of four protrusions 29b are formed, with one end E3 of each protrusion 29b being connected to one of the four corners of protrusion 29a. Another end E4 of protrusion 29b is exposed to the outer side of the region of wiring substrate 21a that opposes semiconductor substrate 10. The respective protrusions 29b thus extend toward the outer side of wiring substrate 21a from protrusion, 29a and reach the outer side of the region covered with resin 32.

Even with the semiconductor device having wiring substrate 21a of the above-described arrangement, because, when filling with the resin using the capillary phenomenon, the progress of resin stops upon reaching protrusions 29b, spaces that are not filled with resin 32 are formed above protrusions 29b. The arrangement, wherein resin 32 surrounds the periphery of the gap between thinned portion 14 and wiring substrate 21 except at portions of the periphery, can thus be readily realized.

Figure 7:
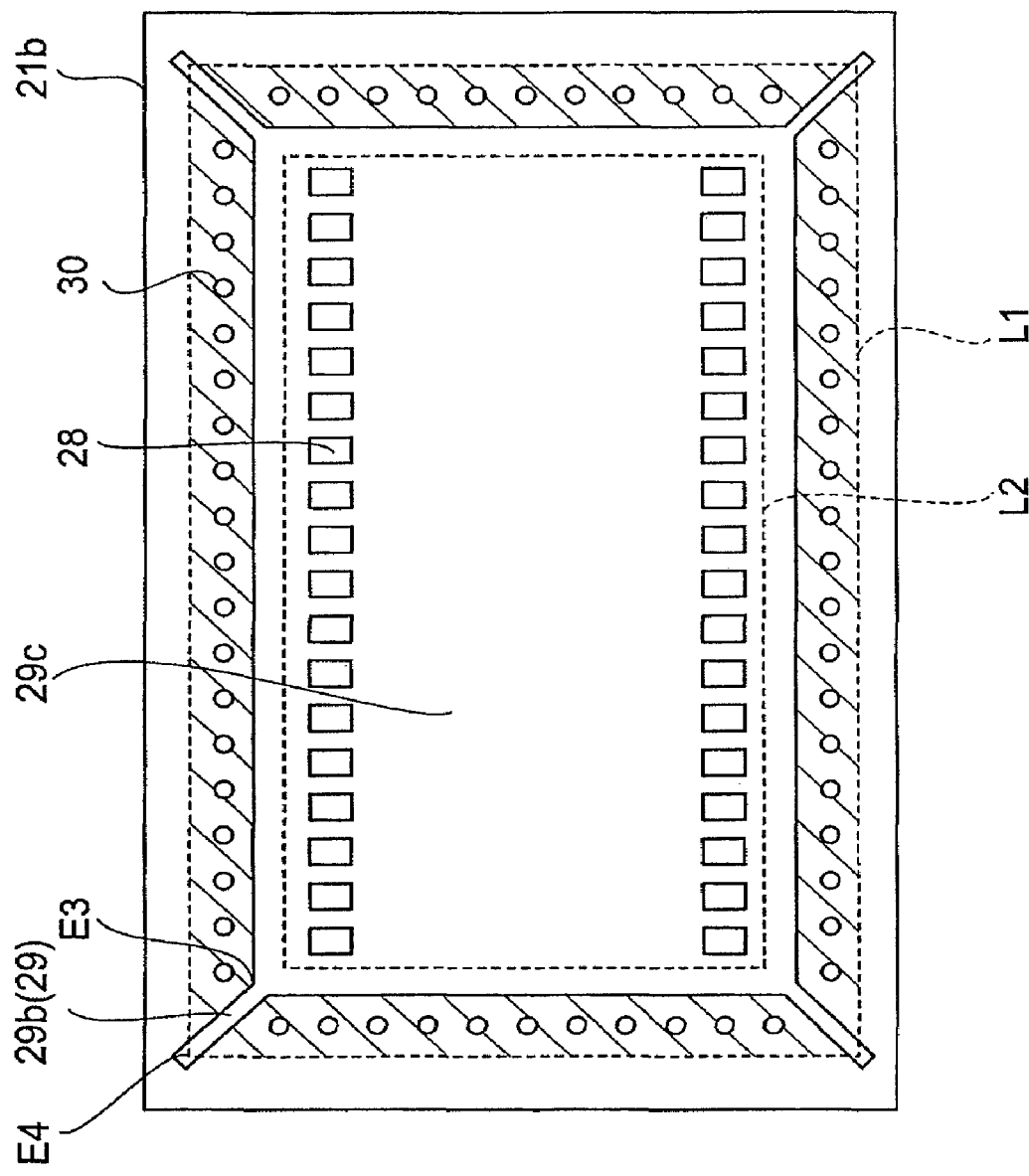
FIG. 7 is a plan view of another modification example of wiring substrate 21 of FIG. 5.

FIG. 7 is a plan view of another modification example of wiring substrate 21 of FIG. 5. Wiring substrate 21b differs from wiring substrates 21 and 21a in the region in which protrusions are formed. The other portions of wiring substrate 21b are the same as those of wiring substrates 21 and 21a. With wiring substrate 21b, the region opposing thinned portion 14 and the region surrounding the region opposing thinned portion 14 are protruded as a whole. This protruding portion is protrusion 29c. The same protrusions 29b as those of FIG. 6 extend from the respective four corners of protrusion 29c to the outer side of wiring substrate 21b.

Figure 8:
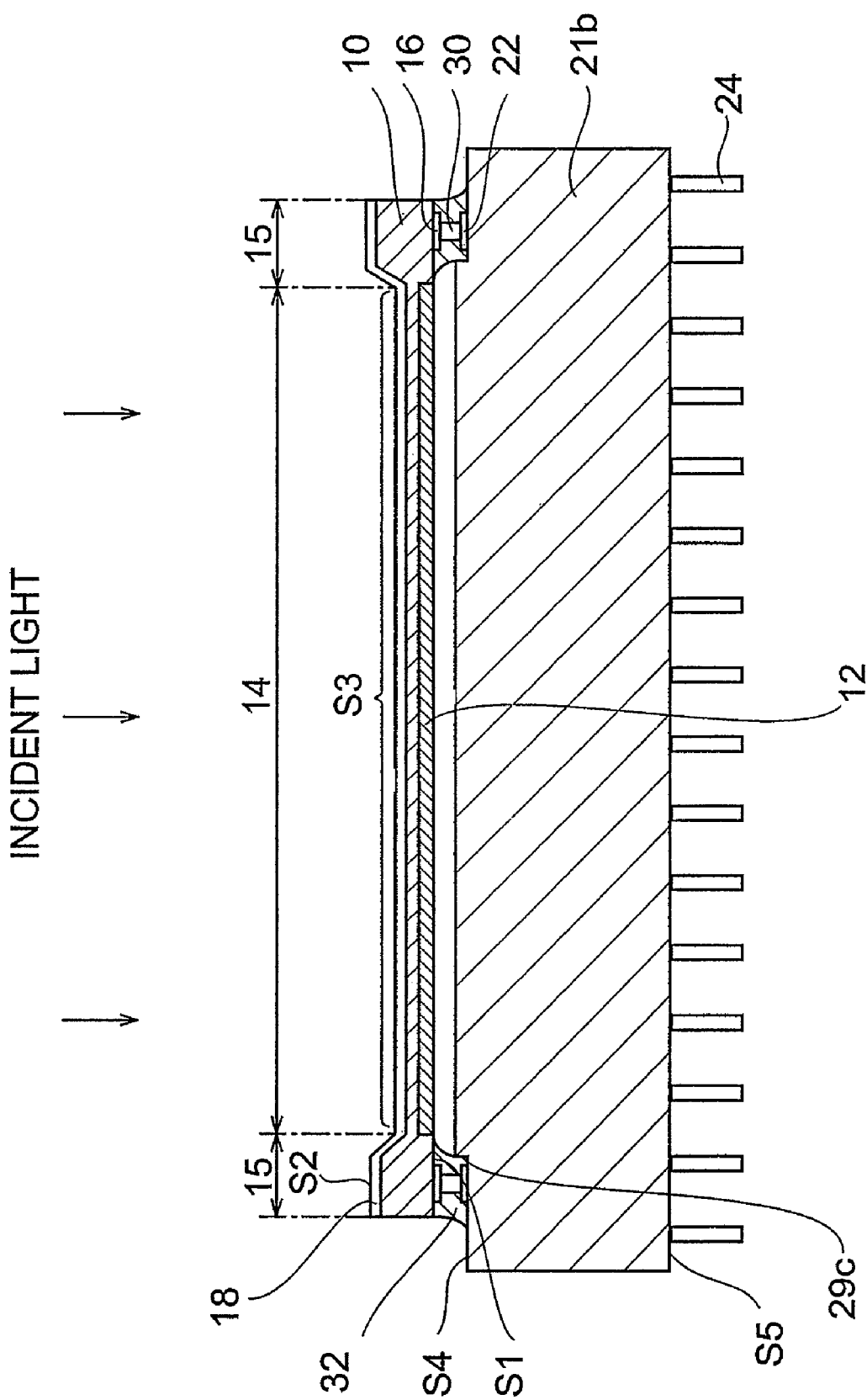
FIG. 8 is a sectional view of an arrangement using a wiring substrate 21b in place of wiring substrate 21 in semiconductor device 2 of FIG. 4.

FIG. 8 is a sectional view of an arrangement using wiring substrate 21b in place of wiring substrate 21 in semiconductor device 2 of FIG. 4. As shown in this sectional view, of the region of wiring substrate 21b that opposes semiconductor substrate 10, protrusion 29c is formed across the entire inner side of the region covered with resin 32.

Even with the semiconductor device having wiring substrate 21b of the above-described arrangement, when filling with the resin using the capillary phenomenon, further progress of the capillary phenomenon stops and the entry of the resin stops when the resin that enters into the gap from the periphery of semiconductor substrate reaches protrusion 29c. By such a protrusion 29c being provided on wiring substrate 21, the arrangement, wherein resin 32 fills the gap at which conductive bumps 30 exist, that is, the gap between wiring substrate 21b and outer edge 15 of thinned portion 14 while the gap between thinned portion 14 and wiring substrate 21b is left unfilled, can be readily realized. Also, with this embodiment, because the region opposing thinned portion 14 of wiring substrate 21b can be surrounded by a protrusion by forming just one protrusion 29c, manufacturing is facilitated in comparison to wiring substrates 21 and 21a of 4 arrangements wherein the above-mentioned region is surrounded by protrusions 29a of the form of protruding strips.

Figure 9:
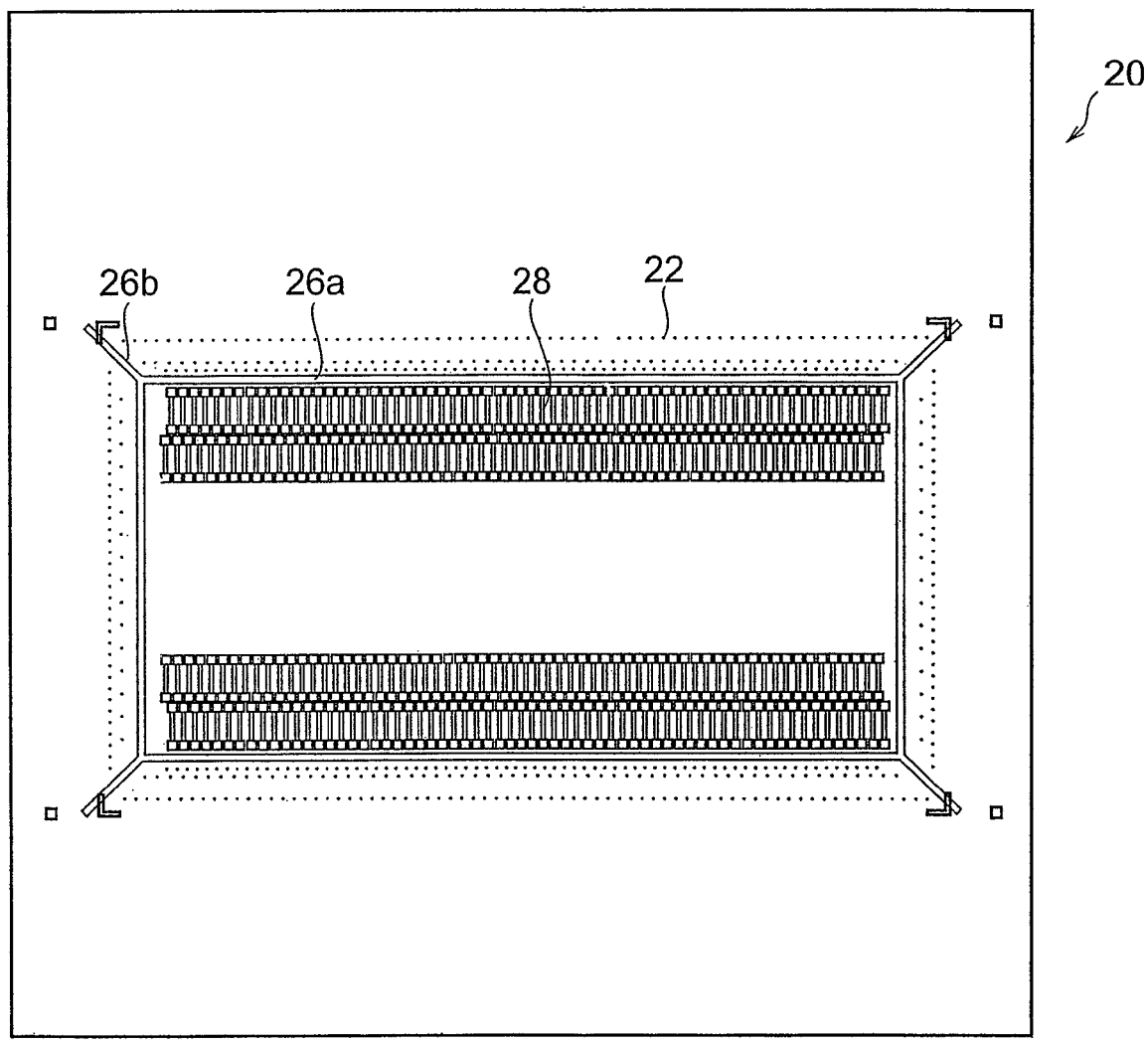
FIG. 9 is a plan view of an arrangement example of wiring substrate 20 of FIG. 1.

FIG. 9 is a plan view of an arrangement example of wiring substrate 20 of FIG. 1. Wiring substrate 20 of this arrangement example is a multilayer ceramic substrate. This wiring substrate 20 has a square shape of 58.420 mm square in plan view and has the silicone resin coated onto region 26a that defines a rectangle of 38.700 mm×18.900 mm. The silicone resin is also coated onto regions 26b that respectively extend outward from the four corners of region 26a. The plurality of chip resistors 28 are disposed in the rectangular region surrounded by region 26a. In this region, chip resistors 28 are aligned one-dimensionally in the left/right direction of the Figure (in the direction of the long sides of the rectangle) in two columns at each of an upper portion and a lower portion in the Figure. The plurality of electrodes 22 are formed in a region at the outer side of region 26a. Electrodes 22 are aligned along each of the four sides of the rectangle, forming three columns along each of the long sides and forming two columns along of each the short sides. The diameter of each electrode 22 is 0.080 mm.

Figure 10:
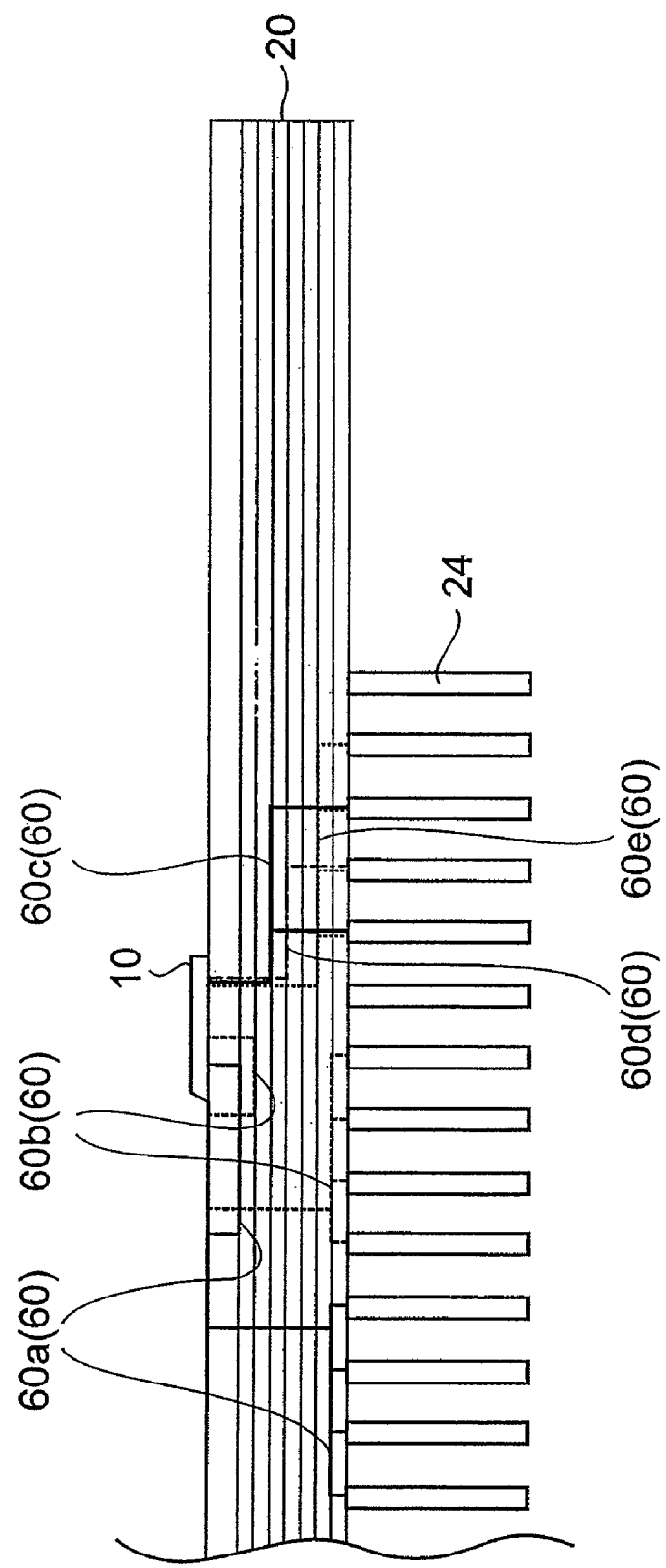
FIG. 10 is a sectional view of an arrangement of internal wirings of wiring substrate 20 of the arrangement example of FIG. 9.
Figure 11:
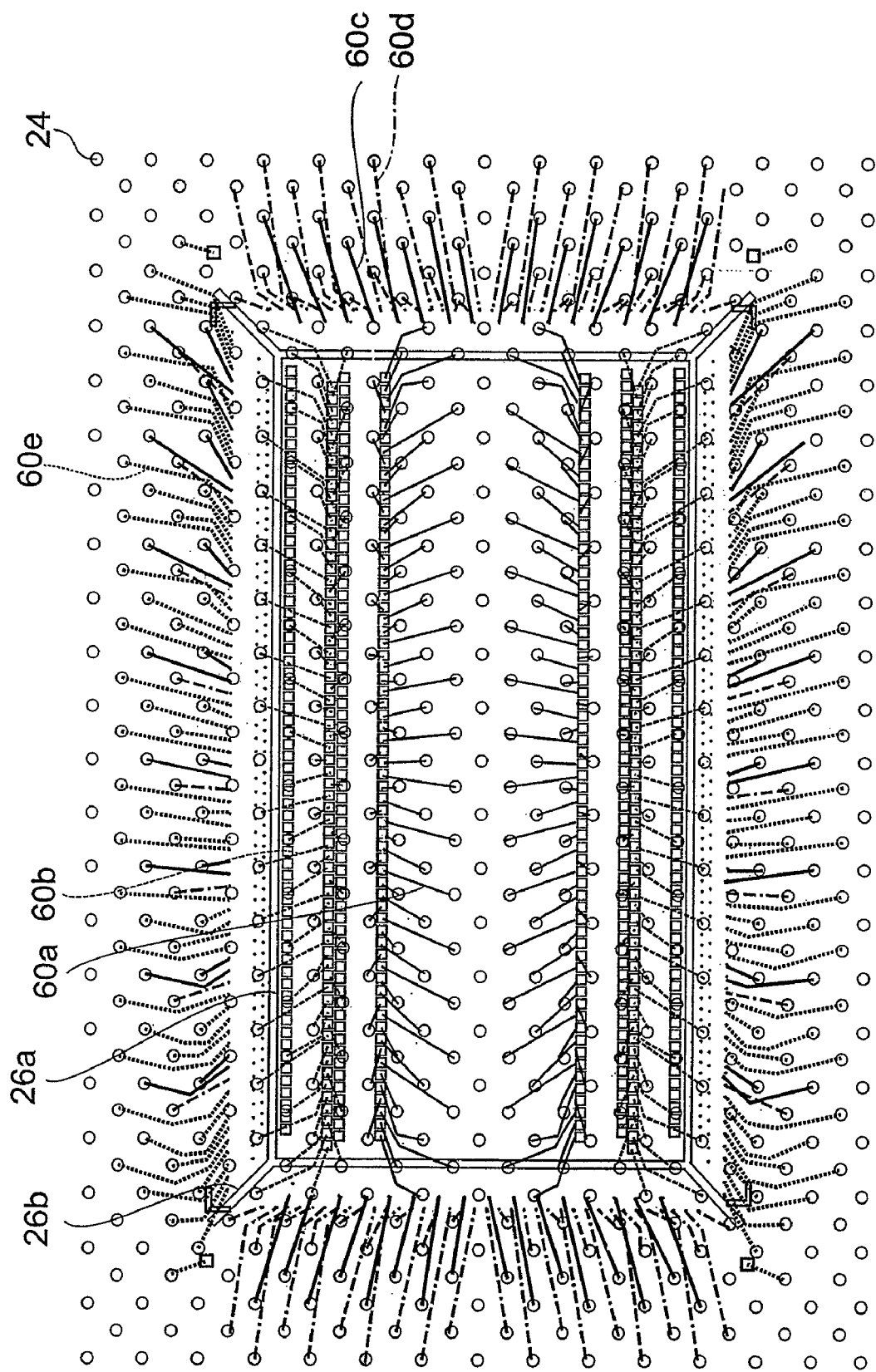
FIG. 11 is a sectional view for describing the arrangement of internal wirings 60 of FIG. 10.

FIG. 10 is a sectional view of an arrangement of internal wirings of wiring substrate 20 of the arrangement example of FIG. 9. Internal wirings 60 include signal output wirings 60a and 60b, clock supplying wirings 60c and 60d, and DC bias (ground) supplying wirings 60e. Each internal wiring 60 electrically connects an electrode 22, a lead terminal 24, and a chip resistor 28 to each other. The arrangement of internal wirings 60 shall now be described in more detail using FIG. 11. In FIG. 11, lead terminals 24 are indicated overlappingly on a plan view of wiring substrate 20 for the sake of description. As shown in this Figure, whereas only signal output wirings 60a and 60b are formed at portions to the inner side of region 26a, clock supplying wirings 60c and 60d and DC bias (clock) supplying wiring 60e are formed at portions to the outer side of region 26a. By thus positioning the driving system wirings of clock supplying wirings 60c and 60d and DC bias supplying wiring 60e separately from signal output wirings 60a and. 60b, the occurrence of crosstalk between the driving system signals and the output system signals can be prevented.

This invention's semiconductor device is not restricted to the embodiment described above and various modifications are possible. For example, although an arrangement, wherein region 26a completely surrounds the region of wiring substrate 20 that opposes thinned portion 14, was shown in FIG. 2, an arrangement, wherein region 26a surrounds the region except at portions of the periphery of the region, is also possible.

Also, although an arrangement, wherein regions 26b that are coated with silicone resin are disposed at four locations, was shown in FIG. 2, an arrangement, wherein this region is disposed at only one location, is possible as is an arrangement, wherein these regions are disposed at two locations or more. Likewise, although an arrangement, wherein eight protrusions 27b are formed, and an arrangement, wherein four protrusions 27b are formed, were shown in FIG. 5 and FIG. 6, respectively, an arrangement, wherein just one protrusion 27b is formed, is possible as well as an arrangement, wherein no less than two protrusions 27b are formed.

INDUSTRIAL APPLICABILITY

This invention concerns a semiconductor device and can be used especially in a back-illuminated semiconductor device.

The invention claimed is:

1. A back-illuminated semiconductor device comprising:
a semiconductor substrate, having
    a photodetecting unit formed on one surface,
    a recess, opposing the photodetecting unit, of another surface,
    an outer edge surrounding the recess,
    and first electrodes disposed on the one surface at the outer edge and electrically connected to the photodetecting unit;
a wiring substrate, disposed to oppose the one surface side of the semiconductor substrate and having second electrodes connected via conductive bumps to the first electrodes; and
a resin, filling a gap between the wiring substrate and the outer edge with the conductive bumps;
wherein the wiring substrate has a first region and second regions, the first region surrounding a region opposing the recess and the second regions extending outward from the first region, wherein the first region and the second regions have lower wettability with respect to the resin than the other regions of the wiring substrate, and
the resin surrounds the periphery of the gap between the recess and the wiring substrate except at the second regions that are portions of the periphery, thereby spaces not filled with the resin are formed above the second regions positioned between the semiconductor substrate and the wiring substrate.

2. The semiconductor device according to claim 1, wherein a silicone resin, a polytetrafluoroethylene, or a wax is coated onto the first region and the second regions of the wiring substrate.

3. The semiconductor device according to any of claim 1 or claim 2, wherein the photodetecting unit has a plurality of pixels that are arrayed one-dimensionally or two-dimensionally.

4. The semiconductor device according to claim 1, wherein the photodetecting unit has a plurality of pixels that are arrayed one-dimensionally.

5. The semiconductor device according to claim 1, wherein the photodetecting unit has a plurality of pixels that are arrayed two-dimensionally.

* * * * *